United States Patent
Krotsch

(10) Patent No.: US 7,405,609 B2
(45) Date of Patent: Jul. 29, 2008

(54) CIRCUIT ARRANGEMENT FOR DRIVING AN ELECTRICAL CIRCUIT BREAKER AT HIGH VOLTAGE POTENTIAL

(75) Inventor: Jens Krotsch, Niederstetten (DE)

(73) Assignee: EBM-PAPST Mulfingen GmbH & Co. KG

( * ) Notice: Subject to any disclaimer, the term of this patent is extended or adjusted under 35 U.S.C. 154(b) by 101 days.

(21) Appl. No.: 11/409,332

(22) Filed: Apr. 21, 2006

(65) Prior Publication Data

US 2006/0238947 A1  Oct. 26, 2006

(30) Foreign Application Priority Data

Apr. 22, 2005 (EP) .................................. 05103276

(51) Int. Cl.
*H03K 17/687* (2006.01)
(52) U.S. Cl. ...................................... 327/427; 327/430
(58) Field of Classification Search .................... None
See application file for complete search history.

(56) References Cited

U.S. PATENT DOCUMENTS

| | | | | |
|---|---|---|---|---|
| 5,128,603 A | * | 7/1992 | Wolfel | 323/282 |
| 5,352,932 A | | 10/1994 | Tihanyi | |
| 5,808,504 A | * | 9/1998 | Chikai et al. | 327/434 |
| 6,285,235 B1 | * | 9/2001 | Ichikawa et al. | 327/374 |
| 2004/0012411 A1 | | 1/2004 | Guedon et al. | |

* cited by examiner

*Primary Examiner*—N. Drew Richards
*Assistant Examiner*—An T. Luu
(74) *Attorney, Agent, or Firm*—Brinks Hofer Gilson & Lione

(57) ABSTRACT

The invention relates to an electrical circuit arrangement for driving switching power semiconductor components at high voltage potential with a control signal predetermining a switching information for the power semiconductor component and an output voltage directly controlling the power semiconductor component. A non-controllable semiconductor valve is used as component with high dielectric strength for transferring the switching energy and the switching information.

9 Claims, 4 Drawing Sheets

CIRCUIT ARRANGEMENT FOR DRIVING AN ELECTRICAL CIRCUIT BREAKER AT HIGH VOLTAGE POTENTIAL

BACKGROUND AND SUMMARY OF THE INVENTION

The invention relates to an electrical circuit arrangement for driving switching power semiconductor components at high voltage potential with a control signal predetermining a switching signal for the power semiconductor component and an output voltage directly controlling the power semiconductor component, a non-controllable semiconductor gate being used for transferring a switching energy.

The power of electrical loads such as, e.g., electric motors, is set by converter circuits which have one or more controllable or non-controllable power semiconductor components such as, e.g., power semiconductor gates. Controllable power semiconductor gates are transistors and thyristors, the diode is non-controllable. The switching state of controllable semiconductor gates is predetermined as a function of input signals, particularly power control signal, speed or rotor position of a motor, by an open- or closed-loop control. The open- or closed-loop control provides the switching signal in the form of logic signals which are converted by driver circuits to the levels and potentials required for driving the power semiconductor components.

In the case of electrical loads needing high supply voltages, e.g. machines connected to single-phase or three-phase AC voltage systems, semiconductor components having a high dielectric strength must be used. Implementation of these as integrated circuits is only possible with great expenditure. The cost for the driver circuit will present a considerable proportion of the total cost of a power controller.

From the prior art, circuit arrangements are known in which a power transistor as controllable semiconductor component determines the load current flowing via its collector-emitter path to a load, and thus the electrical power supplied to the load. Via a driver stage, a gate-emitter voltage of predetermined magnitude is generated, which in switching mode puts the collector-emitter path of the transistor into the conductive state. In this arrangement, the power supply to the driver stage is independent of the switching state of the transistor via a capacitor which is charged up to the operating voltage of a voltage source via a non-controllable semiconductor gate, a diode. To set the power of the load, a control signal A, which is used as input signal to the driver stage, is predetermined as a switching signal in a control section. Since the driver stage is coupled to the high emitter potential of the power transistor, the control signal A must be converted to this voltage potential by a level converter. Such a circuit arrangement is also called a bootstrap circuit.

Such a circuit arrangement corresponding to the prior art is implemented in the driver chip IR2106 by the company International Rectifier (data sheet IR2106, April 1999). To convert the levels of the switching signal, high-voltage-resistant transistors are used here.

The disadvantageous factor in the prior art shown is that both the semiconductor components, via which the capacitor provides the switching energy for the circuit breaker, and the level converter, via which the switching information is transferred, must have a high dielectric strength. The implementation of the level converter, in particular, is associated with high cost expenditure.

The present invention is based on the object of providing a circuit arrangement for driving electronic circuit breakers at high voltage potential which, compared with the prior art, manages with fewer components with high dielectric strength and can be constructed more inexpensively.

According to the invention, this object is achieved in that the non-controllable semiconductor gate is constructed as component with high dielectric strength for transferring the switching signal.

The arrangement according to the invention enables a switching power semiconductor at a high voltage potential to be driven with only one non-controllable semiconductor valve, i.e. a diode, as a high-voltage component. Compared with the prior art, it is possible to omit an expensive level converter since the non-controllable semiconductor gate according to the invention is not used only for the energy transfer as is the case in the above bootstrap circuit of the prior art but, at the same time, also for converting the desired switching state of the power transistor to the high voltage potential. As a particular advantage compared with known circuit arrangements, this results in distinctly lower costs since a level converter would need at least one further controllable high-voltage, and thus expensive, semiconductor component.

The control signal, as input signal to the circuit arrangement according to the invention, determines the variation of an output voltage of a controllable voltage source which is connected in series with the non-controllable semiconductor gate, polarized in the forward direction, and a capacitor. Advantageously, the signal parameters, particularly magnitude, frequency and duty ratio, of the output voltage of the controllable voltage source can be predetermined by this control signal in such a manner that a continuous change in the power consumption of the load is obtained.

A further advantageous embodiment provides that a circuit section is connected in parallel with the capacitor and is supplied by a voltage occurring across the capacitor which stores the switching information and the switching energy. Due to this circuit combination, i.e. the signal path via the non-controllable semiconductor gate, of two functionally different tasks, in this case the energy supply and the information transfer, there is no necessity for expensive level conversion.

As an extension of this embodiment, a series circuit of a second capacitor and a second non-controllable semiconductor gate, i.e. a diode, but with only little dielectric strength, is provided in parallel with the capacitor. Due to this circuit measure, the second capacitor can handle the task of energy supply whilst the first one stores the switching information and the diode decouples both functions. In this manner, a downstream circuit section can be driven over a greater range.

It is of particular advantage that the circuit section generates an output voltage for driving the power semiconductor component as a function of the capacitor voltage present at the input end. In this arrangement, the output voltage generated is exclusively dependent on the capacitor voltage present at the input of the circuit section. Since this capacitor voltage, in addition to the switching energy, also conveys the information of the switching state according to the invention, the expensive transformation of the switching information to high voltage levels via a level converter can be omitted.

Further suitable embodiments can be found in the subclaims.

BRIEF DESCRIPTION OF THE DRAWINGS

The invention is explained in greater detail by means of the exemplary embodiment shown in the attached drawings, in which.

DETAILED DESCRIPTION OF THE INVENTION

Figure 1:
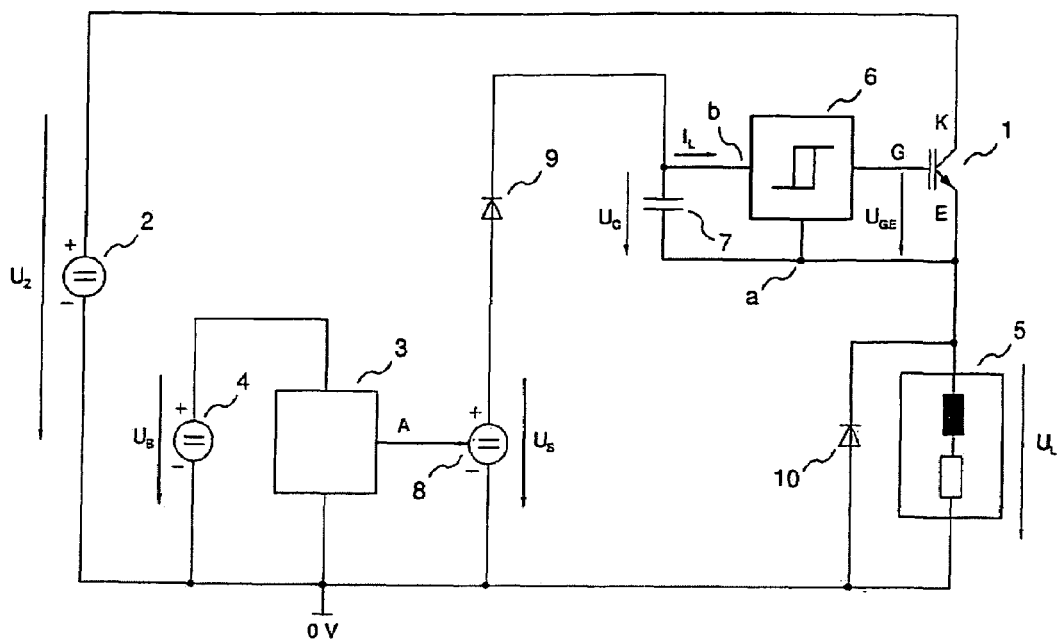
FIG. 1 shows an exemplary application of a circuit arrangement according to the invention.

FIG. 1 shows an exemplary application of the circuit arrangement according to the invention with external wiring. The circuit arrangement according to the invention is composed of a circuit section 6, a capacitor 7, a controllable voltage source 8 and a non-controllable semiconductor gate 9, i.e. a diode. The external wiring comprises a controllable power semiconductor component 1 with its collector K, a gate G and an emitter E, a direct-voltage source 2, a control section 3 which is supplied by a voltage source 4, and a load 5 with a freewheeling diode 10.

The power semiconductor component 1 is connected with its collector K to a positive terminal of the direct-voltage source 2. The emitter E of the power semiconductor component 1 is connected to the load 5 and the latter is connected to a negative terminal of the direct-voltage source 2. The freewheeling diode 10 connected in parallel with the load 5 handles possible inductive freewheeling currents (reverse-biased voltage and current spikes). To put the power semiconductor component 1 into the conductive state, a positive gate-emitter voltage $U_{GE}$ of predetermined amplitude must be applied. This is done by the circuit section 6 which is supplied via the capacitor 7 at the connecting points a, b. The controllable voltage source 8, the output voltage $U_S$ of which is determined by a control signal A of the control section 3, is connected to the capacitor 7 in series circuit via the non-controllable semiconductor gate 9 polarized in the forward direction.

In contrast to a driver stage as is used instead of the circuit section 6 according to the prior art, the circuit section 6 in this embodiment of the arrangement according to the invention does not have a separate input for inputting the desired switching state of the power semiconductor component 1. The switching state is exclusively dependent on a voltage $U_C$ occurring across the capacitor 7, the variation of which, in turn, depends on the output voltage $U_S$ of the controllable voltage source 8 which is adjustable by means of the control signal A.

In this arrangement, the non-controllable semiconductor gate 9 according to the invention is not only used for transferring the switching energy for the power semiconductor component 1 but, at the same time, also for conveying the required switching state of the power semiconductor component 1. The non-controllable semi-conductor gate 9 is thus the only semiconductor component with high dielectric strength required for transferring the switching energy and the switching information.

Figure 2:
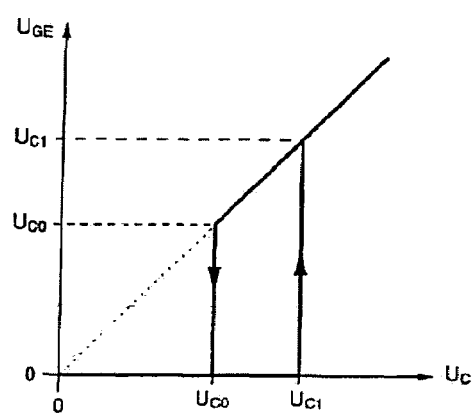
FIG. 2 shows an input/output voltage characteristic of a circuit section according to the invention.

FIG. 2 shows the input/output voltage characteristic of the circuit section 6. The output voltage $U_{GE}$ of the circuit section 6 is shown as static function of the capacitor voltage $U_C$ present across the circuit section 6. If the capacitor voltage $U_C$ is greater than a predefined upper voltage limit value $U_{C1}$, an output voltage $U_{GE}$ is generated which is greater than or equal to the capacitor voltage $U_C$. If the capacitor voltage $U_C$ is less than a predefined lower voltage limit value $U_{C0}$ which is always less than $U_{C1}$, an output voltage $U_{GE}$ is generated which is less than or equal to the capacitor voltage $U_C$. The limit values $U_{C0}$ and $U_{C1}$ are specified in advance in dependence on the specific switching characteristic of the power semiconductor component 1 in such a manner that a capacitor voltage $U_C > U_{C1}$ leads to a reliable conduction of the power semiconductor component 1 and a capacitor voltage $U_C < U_{C0}$ leads to a reliable cutting-off of the power semiconductor component 1.

Figure 3:
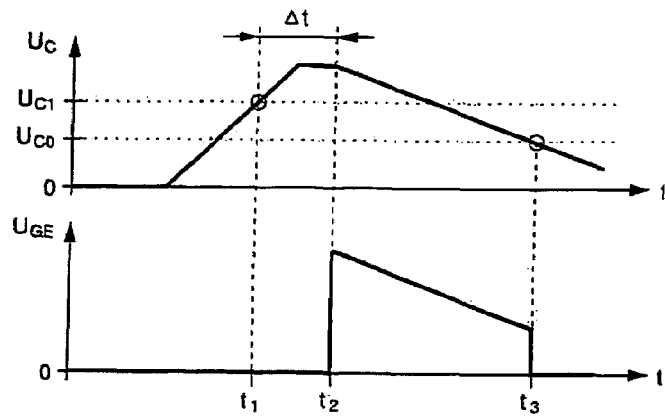
FIG. 3 shows a dynamic characteristic of the circuit section according to the invention.

FIG. 3 illustrates the dynamic characteristic of the circuit section 6. The capacitor voltage $U_C$ at the input and the output voltage $U_{GE}$ are shown with respect to time. At time $t_1$, the voltage $U_C$ exceeds the predefined upper voltage limit value $U_{C1}$. After a fixed delay $\Delta t$, the circuit section 6 then generates at time $t_2$ an output voltage $U_{GE}$ which, according to the characteristic described in FIG. 2, has at least the magnitude of the capacitor voltage $U_C$. At time $t_3$, $U_C$ drops below the lower voltage limit value $U_{C0}$ in the exemplary characteristic, whereupon the circuit section 6 generates as low an output voltage $U_{GE}$ as possible—the value zero is shown here according to the characteristic—without delay.

According to FIG. 1, when the power semiconductor component 1 is conducting, almost the entire voltage $U_Z$ of the direct-voltage source 2 is present across the load 5 and the non-controllable semiconductor gate 9 is cut off. The capacitor 7 discharges, e.g. via the internal power consumption $I_L$ of the circuit section 6 or via a discharge resistor specially provided for this purpose or a discharge current source, not shown in order to simplify FIG. 1. If the capacitor voltage $U_C$ becomes less than the lower voltage limit value $U_{C0}$ due to the discharge, the power semiconductor component 1 is cut off. The on-period of the power semiconductor component 1 can thus be predetermined via the magnitude of the capacitor voltage $U_C$.

To predetermine the capacitor voltage $U_C$, a controllable voltage source 8 is provided which is also connected to the reference potential 0 V with its negative terminal and the voltage $U_S$ of which is determined in accordance with magnitude, frequency and duty ratio by the control section 3. If then the power semiconductor component 1 is cut off, the emitter terminal E of the power semiconductor component 1, and thus the terminal of the capacitor 7 not connected to the non-controllable semiconductor gate 9, is connected with low impedance to the reference potential 0 V via the load 5. The non-controllable semiconductor gate 9 becomes conductive and the capacitor abruptly charges up to the voltage $U_S$. If $U_C$ is $> U_{C1}$, the power semiconductor component 1 becomes conductive and remains in the conductive state until the capacitor voltage $U_C$ becomes $< U_{C0}$. The discharge current $I_L$ is always specified in such a manner that the discharging process is much slower than the charging process via the non-controllable semiconductor gate 9, i.e. the charging period is, e.g., 1/20 of the discharging period.

Figure 4:
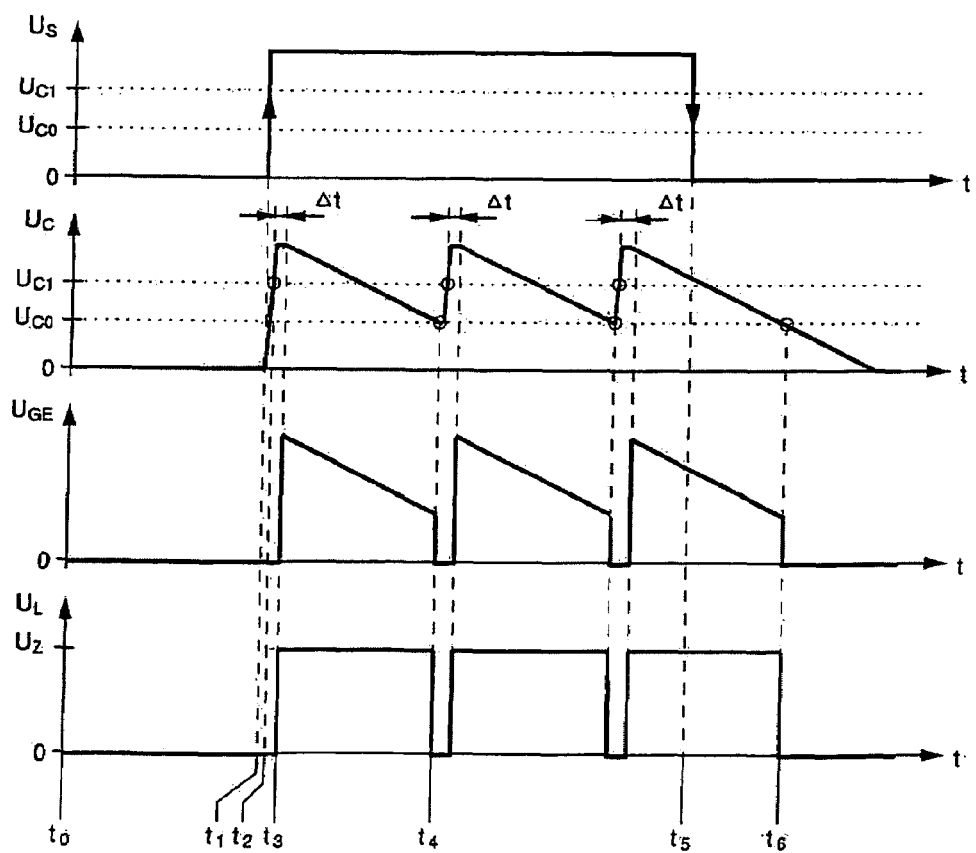
FIG. 4 shows voltage variations of an output voltage of a controlled voltage source, of a capacitor voltage, of an output voltage of the circuit section and of a voltage present at a load when a rectangular pulse is input.

FIG. 4 shows by way of example, with a rectangular pulse with the voltage values $U_S=0$ V and $U_S>U_{C1}$ being input as voltage variation $U_S$ of the controlled voltage source 8 for the circuit arrangement according to the invention according to FIG. 1, the voltage variations of the capacitor voltage $U_{C1}$ of the output voltage $U_{GE}$ of the circuit section 6, which corresponds to the control voltage of the power semiconductor component 1, and the voltage $U_L$ present across the load.

Starting with an uncharged capacitor 7 and power semiconductor component 1 cut off, the load 5 is initially currentless at time $t_0$. At time $t_1$, the control section 3 generates a control signal A which leads to a jump in the voltage $U_S$ across the controllable voltage source 8 to a value which is greater than the upper voltage limit value $U_{C1}$. The capacitor 7 charges up to the voltage $U_S$ via the non-controllable semiconductor gate 9 and the load 5. At time $t_2$, the capacitor voltage $U_C$ exceeds the upper voltage limit value $U_{C1}$. Since $U_C > U_{C1}$, the circuit section 6, according to its characteristic shown in FIG. 2, generates a positive output voltage $U_{GE}$ at time $t_3$ after a predefined delay $\Delta t$. As a result, the power semiconductor component 1 becomes conductive, the voltage $U_L$ across the load 5 is now almost $U_Z$. As a result, the non-controllable semiconductor gate 9 is cut off and the capacitor 7 slowly discharges through the current $I_L$. If the capacitor voltage $U_C$ drops below the lower voltage limit value $U_{C0}$ as is the case at time $t_4$, the output voltage $U_{GE}$ of the circuit section 6 is directly forced to a small value which leads to the power semiconductor component 1 being cut off. As a result, the emitter terminal E of the power semiconductor component 1 is connected with low impedance to the reference potential 0 V via the load 5. The capacitor 7 abruptly charges up to the voltage $U_S$ via the non-controllable semiconductor gate 9 which, in turn, leads to the power semiconductor component 1 being switched on. This process is repeated as long as the voltage is $U_S > U_{C1}$. At time $t_5$, the control section 3, via the control signal A, causes the voltage $U_S$ across the controllable voltage source 8 to drop to a value of less than $U_{C0}$, particularly equal to 0, as a result of which the power semiconductor component 1 remains in the cut-off state after the switching-off at time $t_6$.

Thus, as described, a voltage can be applied to the load 5, or disconnected from it, in dependence on the control signal A. In contrast to the prior art, however, no level converter with high dielectric strength is required for driving the power semiconductor component 1 in the invention.

In a further advantageous embodiment of the invention, it is provided to adjust the power of the load continuously by pulse-width modulation of the voltage $U_S$ of the controllable voltage source 8. For this purpose, the control signal A is predetermined by the control section 3 in such a manner that a rectangular periodic variation of the voltage $U_S$ across the controllable voltage source 8 is produced. In this respect, FIGS. 5 and 6 show for the circuit arrangement according to FIG. 1 according to the invention, by way of example, the variations of the voltage $U_S$ across the controllable voltage source 8, of the capacitor voltage $U_C$, of the output voltage $U_{GE}$ of the circuit section 6 and of the voltage $U_L$ across the load 5.

Figure 5:
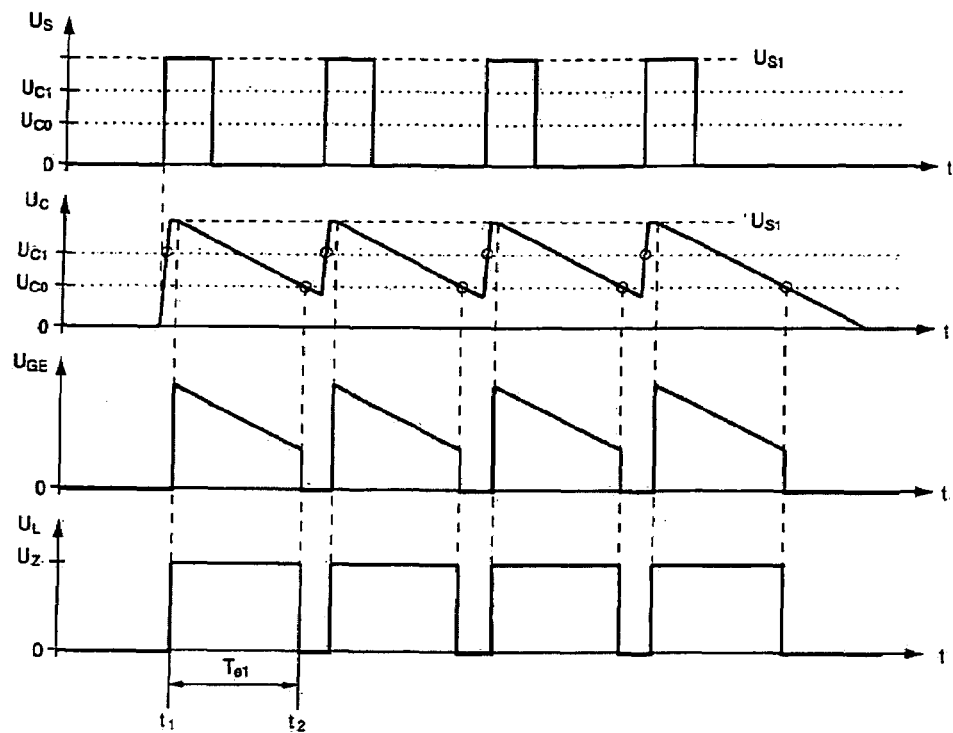
FIG. 5 shows voltage variations of the output voltage of the controlled voltage source, of the capacitor voltage, of the output voltage of the circuit section and of the voltage present at the load when a periodic sequence of rectangular pulses is input.
Figure 6:
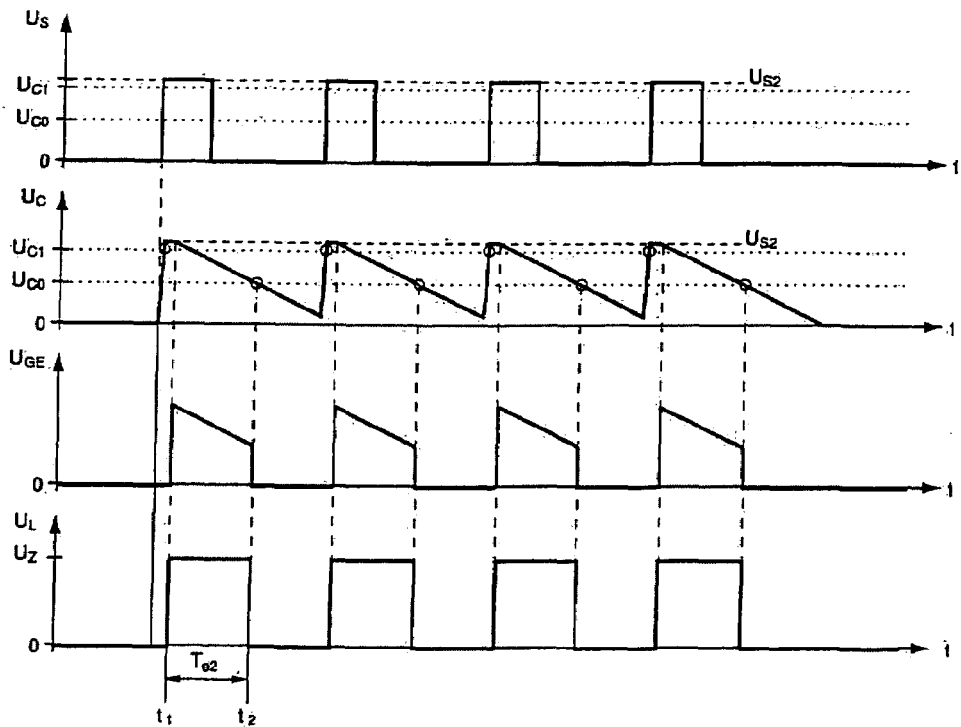
FIG. 6 shows voltage variations of the output voltage of the controlled voltage source, of the capacitor voltage, of the output voltage of the circuit section and of the voltage present across the load when the periodic sequence of rectangular pulses is input with changed amplitude compared with FIG. 5.

FIG. 5 shows a periodic sequence of rectangular pulses with predefined frequency and fixed duty ratio as voltage variation of the controlled voltage source 8 with the voltage amplitude $U_{S1}$. The discharge time of the capacitor 7, i.e. the period between $t_1$ and $t_2$ until the capacitor voltage $U_C$ drops below the limit $U_{C0}$, is relatively long and the on-period $T_{e1}$ of the power semiconductor component 1 is large, therefore. On average, a large voltage $U_L$ is present across the load. In contrast, FIG. 6 shows a periodic sequence of rectangular pulses having the same frequency and the same duty ratio, but a lower voltage amplitude $U_{S2}$. The discharge time of the capacitor 7, i.e. the period between $t_1$ and $t_2$ until the capacitor voltage $U_C$ drops below the limit $U_{C0}$, is relatively short and the on-period $T_{e2}$ of the power semiconductor component 1 is short, therefore. On average, a low voltage $U_L$ is present across the load. Using the circuit arrangement according to the invention as described, the voltage $U_L$, and thus the power of the load 5, is continuously variable by changing the amplitude of the voltage $U_S$.

Figure 7:
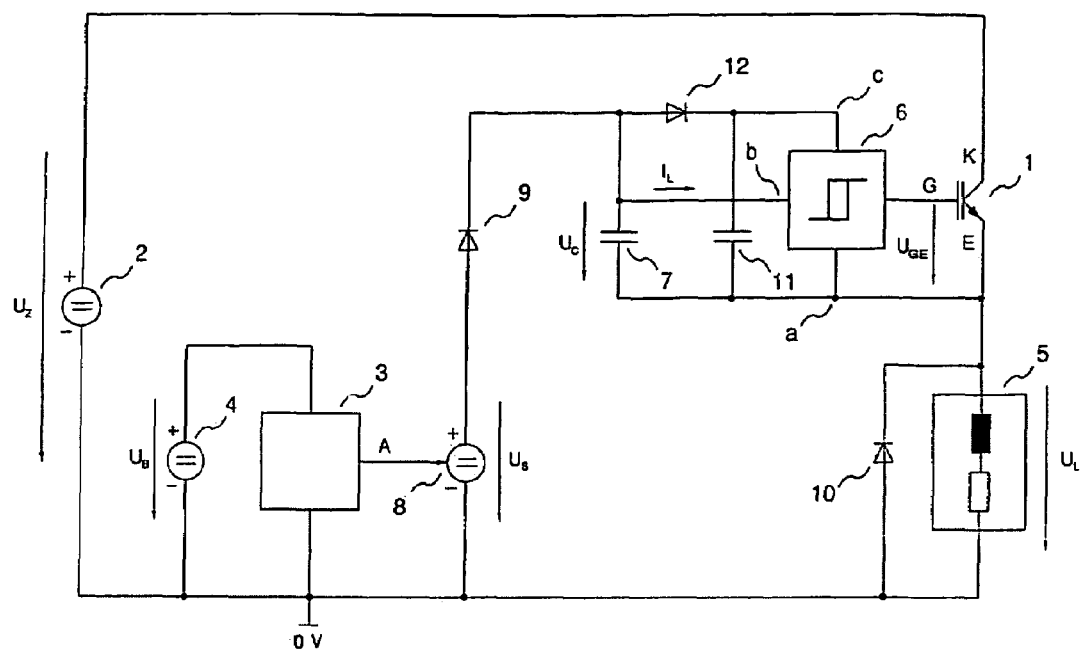
FIG. 7 shows a further exemplary embodiment of the circuit arrangement according to the invention.

FIG. 7 shows a further exemplary embodiment of the circuit arrangement according to the invention. A series circuit of a second capacitor 11 having a greater capacity and a second non-controllable semiconductor gate (diode) 12 with only low dielectric strength is connected in parallel with the capacitor 7. The circuit section 6 has a third terminal c which is connected to the voltage potential located between the second non-controllable semiconductor gate 12 and the second capacitor 11. The rules of FIGS. 2 and 3 apply to the capacitor voltage $U_C$ present across a connecting points a, b. In this circuit embodiment, the task of energy supply is handled by the capacitor 11. The capacitor 7 of lesser capacitance is used for storing the switching information and both functions are decoupled by the semiconductor gate 12.

While the above description constitutes the preferred embodiment of the present invention, it will be appreciated that the invention is susceptible to modification, variation and change without departing from the proper scope and fair meaning of the accompanying claims.

The invention claimed is:

1. An electrical circuit arrangement for driving a switching power semiconductor component at a high voltage potential, the electrical circuit arrangement comprising, a circuit configured to convey a control signal (A) including switching information for the power semiconductor component, the switching information being transferred to an output voltage directly controlling the power semiconductor component, a non-controllable semiconductor gate being used for transferring switching energy, wherein the non-controllable semiconductor gate is constructed as a component with high dielectric strength for transferring the switching information:
   wherein the control signal (A) determines the variation of a second output voltage ($U_s$) of a controllable voltage source which is connected in series with the non-controllable semiconductor gate and polarized in the forward direction, and a capacitor arrangement.

2. The electrical circuit arrangement as claimed in claim 1, wherein a circuit section is connected in parallel with first and second connecting points of the capacitor arrangement supplied by a voltage ($U_c$) occurring across the capacitor arrangement connection point which provides the switching information and the switching energy.

3. The electrical circuit arrangement as claimed in claim 2, wherein the circuit section generates the output voltage ($U_{GE}$) for driving the power semiconductor component as a function of the capacitor voltage ($U_C$) present at the input end of the capacitor arrangement.

4. The electrical circuit arrangement as claimed in claim 2, wherein the circuit section has an input/output voltage characteristic which has at the input end a lower voltage limit value ($U_{C0}$) below which the output voltage ($U_{GE}$) is less than or equal to the capacitor voltage ($U_C$) at the input end, and has at the input end an upper voltage limit value ($U_{C1}$) above which the output voltage ($U_{GE}$) is greater than or equal to.

5. The electrical circuit arrangement as claimed in claim 4, wherein, when the upper voltage limit value ($U_{C1}$) is exceeded, the output voltage ($U_{GE}$) is connected with a time delay.

6. The electrical circuit arrangement as claimed in claim 1, wherein the capacitor arrangement comprises a parallel circuit of the capacitor for storing the switching information, with a series circuit of a second capacitor for storing the switching energy, and a second non-controllable semi-conductor gate of low dielectric strength, the circuit section having a third connecting point which is connected to the voltage potential between the second non-controllable semiconductor gate and the second capacitor.

7. The electrical circuit arrangement as claimed in claim 1, wherein one or more of the controllable voltage source is constructed in such a manner that the output voltage ($U_S$) of the controllable voltage source exhibits a rectangular periodic variation with adjustable voltage amplitude.

8. The electrical circuit arrangement as claimed in claim 1, wherein one or more of the amplitude end the frequency and the duty ratio of the rectangular periodic output voltage ($U_S$) of the controllable voltage source is determined by the control signal.

9. The electrical circuit arrangement as claimed in claim 1, wherein the on-period ($T_e$) of the power semiconductor component depends on the magnitude of the output voltage ($U_S$) of the controllable voltage source which is present across the semiconductor gate during the non-conductive state of the power semiconductor component.

\* \* \* \* \*

UNITED STATES PATENT AND TRADEMARK OFFICE
CERTIFICATE OF CORRECTION

PATENT NO. : 7,405,609 B2  Page 1 of 1
APPLICATION NO. : 11/409332
DATED : July 29, 2008
INVENTOR(S) : Jens Krotsch It is certified that error appears in the above-identified patent and that said Letters Patent is hereby corrected as shown below:

In Claim 1, column 6, line 38, after "information" delete ":" and insert --;--.

In Claim 8, column 8, line 2, after "amplitude" delete "end" and insert --and--.

Signed and Sealed this

Sixteenth Day of December, 2008

JON W. DUDAS
*Director of the United States Patent and Trademark Office*